United States Patent [19]
Weigler et al.

[11] Patent Number: 5,220,490

[45] Date of Patent: Jun. 15, 1993

[54] SUBSTRATE INTERCONNECT ALLOWING PERSONALIZATION USING SPOT SURFACE LINKS

[75] Inventors: William Weigler; Lawrence N. Smith, both of Austin, Tex.

[73] Assignee: Microelectronics and Computer Technology Corporation, Austin, Tex.

[21] Appl. No.: 603,614

[22] Filed: Oct. 25, 1990

[51] Int. Cl.⁵ .............................................. H05K 7/02
[52] U.S. Cl. ................................ 361/409; 174/255; 174/261; 361/400; 361/403; 361/414; 361/417; 257/700
[58] Field of Search ............... 361/414, 400, 403, 406, 361/409, 416, 417, 419, 420, 410; 174/254, 260, 255, 261; 437/48; 357/68, 71, 80; 428/901; 237/700

[56] References Cited

U.S. PATENT DOCUMENTS

| | | | |
|---|---|---|---|
| 4,150,421 | 4/1979 | Hishihara et al. | 361/410 |
| 4,245,273 | 1/1981 | Feinberg et al. | 361/382 |
| 4,254,445 | 3/1981 | Ho | 361/409 |
| 4,322,778 | 3/1982 | Barbour et al. | 361/414 |
| 4,371,744 | 2/1983 | Badet et al. | 361/409 |
| 4,458,297 | 7/1984 | Stopper et al. | 361/403 |
| 4,472,765 | 9/1984 | Hughes | 361/413 |
| 4,489,364 | 12/1984 | Chance et al. | 361/395 |
| 4,546,413 | 10/1985 | Feinberg et al. | 361/410 |
| 4,551,789 | 11/1985 | Schettler et al. | 361/409 |
| 4,571,451 | 2/1986 | Linsker et al. | 174/68.5 |
| 4,652,974 | 3/1987 | Ryan | 361/395 |
| 4,689,441 | 8/1987 | Dick et al. | 174/68.5 |
| 4,700,016 | 10/1987 | Hitchcock et al. | 174/68.5 |
| 4,710,592 | 12/1987 | Kimbara | 174/68.5 |
| 4,731,704 | 3/1988 | Lochner | 361/400 |
| 4,791,075 | 12/1988 | Lin | 361/404 |
| 4,799,128 | 1/1989 | Chen | 361/414 |
| 4,803,595 | 2/1989 | Kraus et al. | 361/400 |
| 4,829,404 | 5/1989 | Jensen | 361/400 X |
| 4,888,665 | 12/1989 | Smith | 361/400 |
| 5,060,116 | 10/1991 | Grobman et al. | 361/414 |
| 5,155,577 | 10/1992 | Chance et al. | 361/409 |

FOREIGN PATENT DOCUMENTS

| | | | |
|---|---|---|---|
| 0335281 | 10/1991 | European Pat. Off. | 428/901 |
| 2305914 | 10/1976 | Fed. Rep. of Germany | 361/409 |
| 88308996.3 | 9/1988 | France . | |
| 89102243.6 | 2/1989 | France . | |
| 3-219664 | 9/1991 | Japan | 361/403 |

*Primary Examiner*—Lincoln Donovan
*Assistant Examiner*—D. Sparks
*Attorney, Agent, or Firm*—Arnold, White & Durkee

[57] ABSTRACT

A customizable interconnect circuit wherein a universal substrate of minimum layers is completely customized by programmable conductive links placed only on the top layer of the substrate. The customizable circuit having high density of orthogonally placed X- and Y-conductors capable of interconnecting closely spaced large-scale integrated circuits or discrete electrical components. By utilizing a plurality of interconnect cells regularly spaced throughout a universal, fixed substrate, interconnect routing from overlying electrical components or integrated circuits can be more directly routed to target areas.

28 Claims, 7 Drawing Sheets

SUBSTRATE INTERCONNECT ALLOWING PERSONALIZATION USING SPOT SURFACE LINKS

BACKGROUND OF THE INVENTION

This invention relates to a unique concept and implementation of a technology which allows a set of general purpose, high density, controlled impedance interconnect lines to be completely personalized by forming "spot" links on the top, and only the top, layer of the substrate.

Traditionally, a custom approach has been taken for substrate interconnect design in which each layer in the substrate is custom designed and fabricated for the particular intended application. Recently, the concept of quick turnaround has been introduced into substrate design to minimize the number of custom layers required. In prior arts, quick turnaround substrates have been personalized for each new application by customizing the top few layers using discrete wires or a fabrication process similar to that required for the basic unpersonalized substrate. The disadvantages of the previous approaches are that substrates cannot be stockpiled in completed form, long links are required for final personalization, and expensive processing or clean room facilities are needed.

This invention differs from the U.S. Pat. No. 4,489,364, for example, in two important respects. First, no flywires or discrete jumper wires are required with this invention (i.e., all connections of the present invention are made with spot links), and second, the substrate can be completely personalized with this invention rather than only providing for engineering changes (i.e., much higher interconnect density is allowed). Buried general purpose orthogonal lines were used and the fabrication completed in U.S. Pat. No. 4,458,297 for the quick turnaround substrate, however personalization was accomplished with fusible links. The disadvantage of the latter approach is that either the electrical performance suffers from long stubs remaining in the interconnect networks after personalization or an unacceptable number of fusible links are required for a high density substrate.

SUMMARY OF THE INVENTION

Accordingly, it is desirable to provide only spot links required to complete each network, wherein all links are on the top surface and all links have the same geometrical shape (i.e., spot links). Consequently, final personalization of stockpiled high density substrates can be accomplished with less expensive equipment.

This invention relates to the interconnect of a quick turnaround, multilevel, general purpose, high density substrate by means of a single top personalization layer in which all routed network connections are completed through the use of a spot surface links which may, in principle, have the same geometrical size and shape, thereby permitting the use of less expensive personalizing equipment. A typical substrate design meeting the requirements of the invention claims is described.

In regards to specific terms used herein such as "quick turnaround interconnect", "personalization" and "spot links" used hereinabove and throughout this application, the following definitions are applicable. "Quick turnaround interconnect" refers to a system in which the major portion of interconnect consists of general purpose structures which are designed once and used repeatedly for a variety of new applications. Since only a portion of the substrate requires custom design and fabrication, the turnaround time from design to finished product is reduced. "Personalization" refers to a process by which a general purpose set of fixed geometry line segments in a quick turnaround substrate is tailored or customized for a specific interconnect network. The fixed geometry interconnect line segments are permanent features in the substrate, and personalization consists of linking the endpoints of the segments (and in some cases intermediate points) in some manner to achieve the desired particular interconnect networks. In some implementations, cutting of the segments is also part of the personalization process. "Spot links", as defined here, refers to a short, fixed geometry, electrical connection having a physically small length to width ratio close to unity. Spot links are surface links formed on the top layer of the substrate either by laser assisted techniques, mechanical bonding, or by a mask and chemical process. The geometry of the length is governed solely by process limitations, and does not need to depend upon any particular choice of routing.

The advantages of this patent disclosure are that general purpose substrates can be stockpiled without prior knowledge of their intended final application, thereby reducing the cost of low volume, high diversity, production, and substrates can be personalized for quick turnaround without the need of expensive processing or clean room facilities.

The basic claim of this invention disclosure is the existence, and use of, any routing configuration which permits a fixed underlying pattern of general purpose interconnect lines to be completely personalized on the top layer, and only the top layer of the substrate such that all, or substantially all, personalization is accomplished through the use of spot links. The resulting interconnect substrate can be used instead of a fully custom interconnection and has the same high density with good electrical characteristics.

The basic substrate consists of two or more voltage reference layers, two signal layers and a top personalization/bondpad layer. The reference layers are used for distributing power in the substrate and for controlling the impedance of the signal lines. Alternatively, one reference layer could be combined with the two signal layer to reduce the total number of layer required, and is described in preferred implementation.

The two signal layers consist of fixed orthogonal lines which are broken into segments with the end points brought to the surface layer through vias or pillars. These pillars are referred to as continuation pillars, since links on the surface allow continuation of the network along the same direction, but do not allow corner turning. Each horizontally oriented set of segmented lines overlap a vertically oriented set to form a unit cell. The wide horizontal power distribution lines on the horizontal signal layer are connected to the wide vertical power distribution lines on the vertical signal layer at all intersections through vias or pillars between the two layers. The size of the unit cell is such that several are contained within the area required for a typical integrated circuit die. Additionally, each unit cell contains diagonal rows of pillars connecting two intermediate points on each line segment in the cell to the top surface. These pillars are referred to as corner turning pillars or vias.

An entire 2-inch square substrate would contain on the order of 700 to 800 such unit cells. The large irregular shaped features around the outside of each cell are pads which can be used to TAB outer lead bondpads or wire bondpads for connecting to integrated circuit die. The two rows of small horizontally oriented pads and the two columns of small vertically oriented pads between each unit cell connect to the continuation pillars. The small diagonally oriented pads in the center of each cell connect to the corner turning pillars or vias. Power distribution lines are configured directly under the outer lead bondpads. The small pads between each bondpad alternately connect, around the perimeter of the cell, to either power or ground through pillars or vias in the substrate. That is, every other pad is connected to power, allowing any outer lead bondpad to be connected to either power or ground. The ground pillars pass through openings in the power distribution lines.

The underlying signal lines extend through the center of each cell and pass under all bondpads except the eight bondpads at every corner intersection of four adjacent cells. The long traces in the center of each unit cell and the bars along the continuation pads are isolated islands on the top surface used as an aid for linking various features. The spacing between unit cells is such that the bondpad pitch is continuous from cell to cell.

The present invention therefore provides a single layer personalization of high density interconnect substrates using spot surface links. Applying spot links to only the surface layer provides personalized routing throughout the interconnect system. These and other advantages of the present invention will be further appreciated from the drawings and the detailed description provided below.

DETAILED DESCRIPTION OF THE PREFERRED EMBODIMENTS

Figure 1:
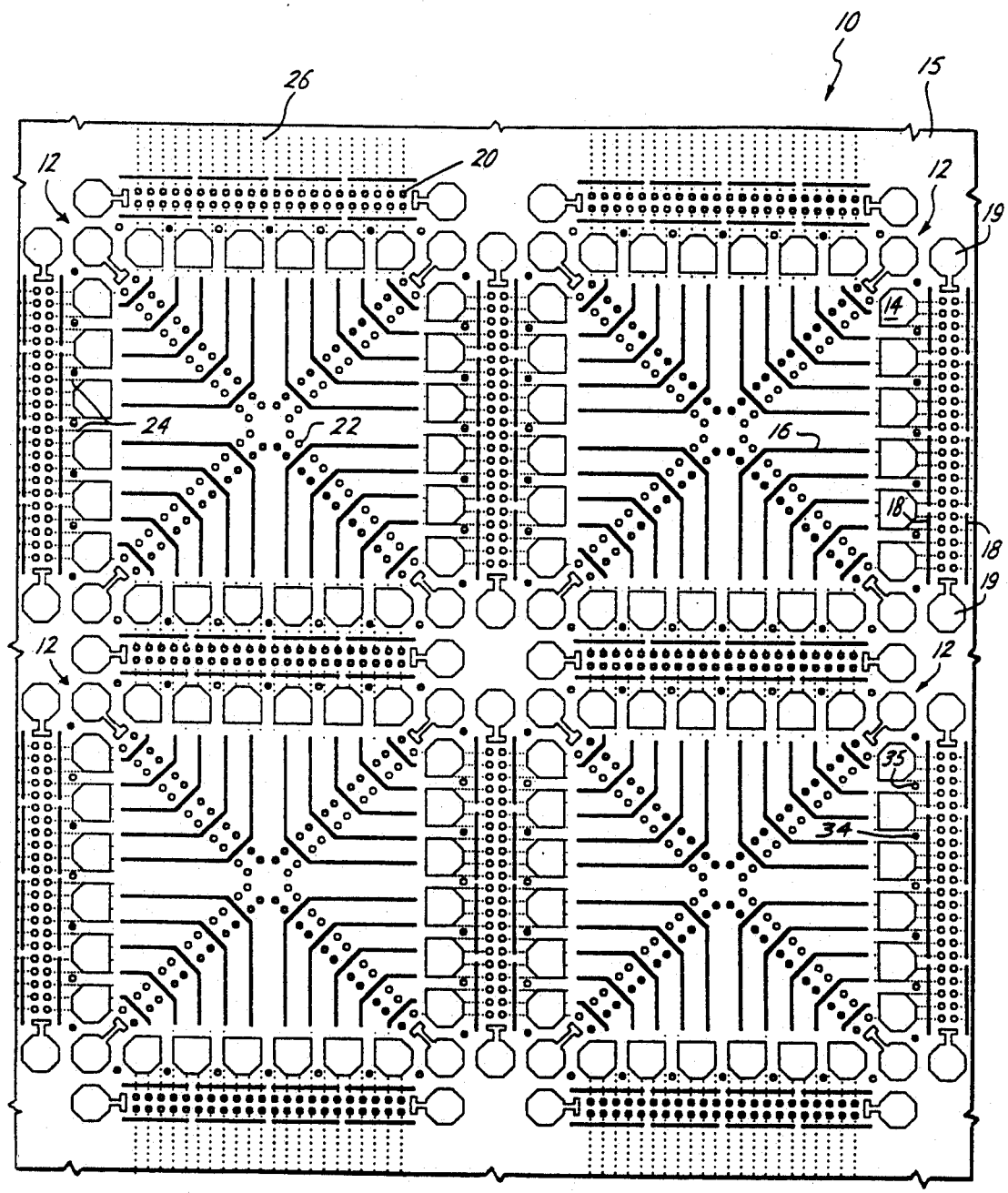
FIG. 1 is a top view of the universal interconnect substrate having four interconnect cells placed side-byside.

Referring to the drawings, FIG. 1 is a top view of a universal interconnect substrate 10 having four interconnect cells 12 arranged in a side-by-side configuration. Each interconnect cell shown with a plurality of bonding pads 14 placed on a surface layer 15. Also, included on the surface layer 15 are corner-turning surface connectors 16 converging inward from the inside surfaces of each bonding pad 14. Configured along the outside surfaces of each bonding pad 14 and between adjacent interconnect cells 12, are channel-hop buses 18 partitioned at predetermined distances. At opposite ends of each row or column of partitioned channel-hop buses are continuation pads 19. Placed between channel-hop buses 18 and between each interconnect cell 12 are rows or columns of continuation vias 20. Continuation vias 20 serve as vias extending downward from surface layer 15 to intermediate layers lying below surface layer 15. Having a similar function as the continuation vias 20 are a plurality of corner-turning vias 22, placed internal to bonding pads 14 of each interconnect cell 12, each corner-turning via extends downward from surface layer to underlying intermediate layers.

Continuation and corner-turning vias 20 and 22 provide access from surface layer 15 to intermediate layers containing a plurality of parallel, horizontally extending X-conductors 24 and a plurality of parallel, vertically extending Y-conductors 26. X-conductors 24 are depicted as dotted lines extending horizontally into each interconnect cell 12, while the Y-conductors are depicted as dotted lines extending vertically into each interconnect cell 12. The dotted lines are not shown within each interconnect cell to avoid drawing confusion with overlying elements; however, the X- and Y-conductors 24 and 26, respectively, extend throughout each interconnect cell 12 in an orthogonal fashion and overlap near each corner-turning vias 22. Shaded corner-turning vias 22 are shown connecting to underlying Y-conductors 26, while non-shaded corner-turning vias are shown connecting to underlying X-conductors 24. The corner-turning vias 22 serve two functions: 1) corner-turning vias 22 provide access from each corner-turning surface connector 16 down to either the X-conductor 24 or Y-conductor 26, and 2) corner-turning vias 22 provide means for connecting the underlying X-conductors 24 to underlying Y-conductors 26 at each orthogonal cross-over point. Conversely, continuation vias 20 serve to connect underlying X-conductors 24 to underlying X-conductors on adjacent cells 12, and to connect underlying Y-conductors 26 to underlying Y conductors on adjacent cells 12. Both the continuation and corner-turning vias 20 and 22 allow access to all X- and Y-conductors 24 and 26 to be performed on only the surface layer 15.

Figure 2:
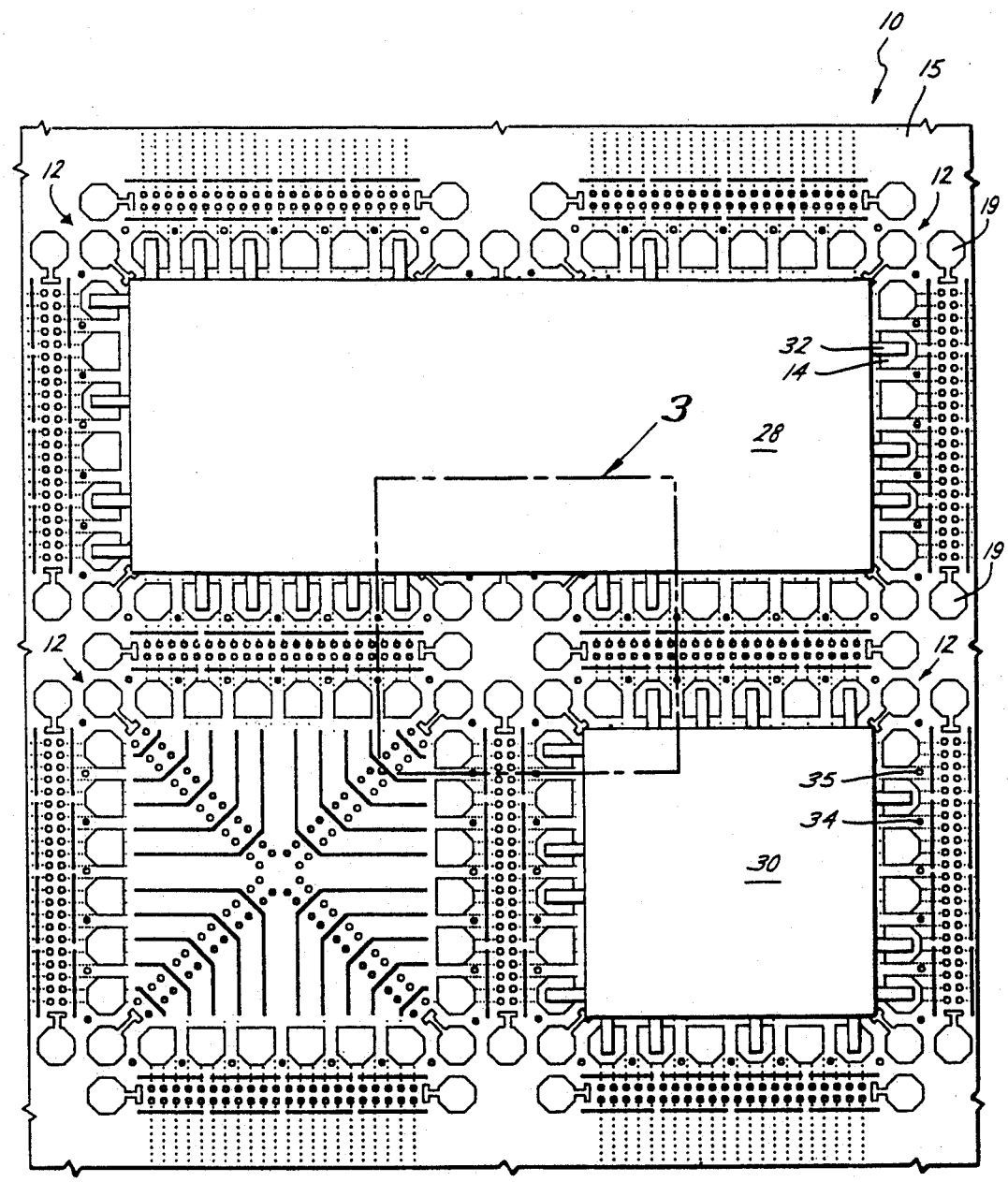
FIG. 2 is a top view of the universal interconnect substrate showing electrical components configured above the universal interconnect substrate.

FIG. 2 illustrates two electrical components 28 and 30 bonded upon surface layer 15 of universal interconnect substrate 10. Electrical component 28 is shown occupying two interconnect cell 12 regions. A plurality of bonding leads 32 connect bonding surfaces on the underneath side of each electrical component 28 and 30 to bonding pads 14 surrounding each interconnect cell 12. Each bonding pad 14 is of sufficient geometry to accommodate wire bonding of the bonding leads 32 onto each bonding pad 14. Also, spacing is uniform between each bonding pad 14 extending the entire length and width of each electrical component 28 and 30. Therefore, the spacing between interconnect cells 12 is such that bonding pad 14 spacing is continuous from one interconnect cell 12 to an adjacent interconnect cell 12. Continuous, uniform spacing is achieved by using continuation pads 19 placed between cells 12 collinear with bonding pads 14. Uniform spacing enables the chip designer easy and direct connection from an electrical component 28 or 30 to underlying bonding pads 14. Bonding leads 32 can be kept short without having to route the leads long distances causing potential shorting or lead dislodgement problems. While FIG. 2 shows only a single configuration by which electrical components 28 and 30 are placed on universal interconnect substrate 10, numerous other configurations can be easily achieved. Large scale integrated circuits can be placed over numerous interconnect cells 12 (e.g. 100 or more) without sacrificing any customizable interconnect performance. It is to be appreciated that universal interconnect substrate 10 has high density interconnect capable of interconnecting large scale integrated circuits placed in close proximity to one another.

Figure 3:
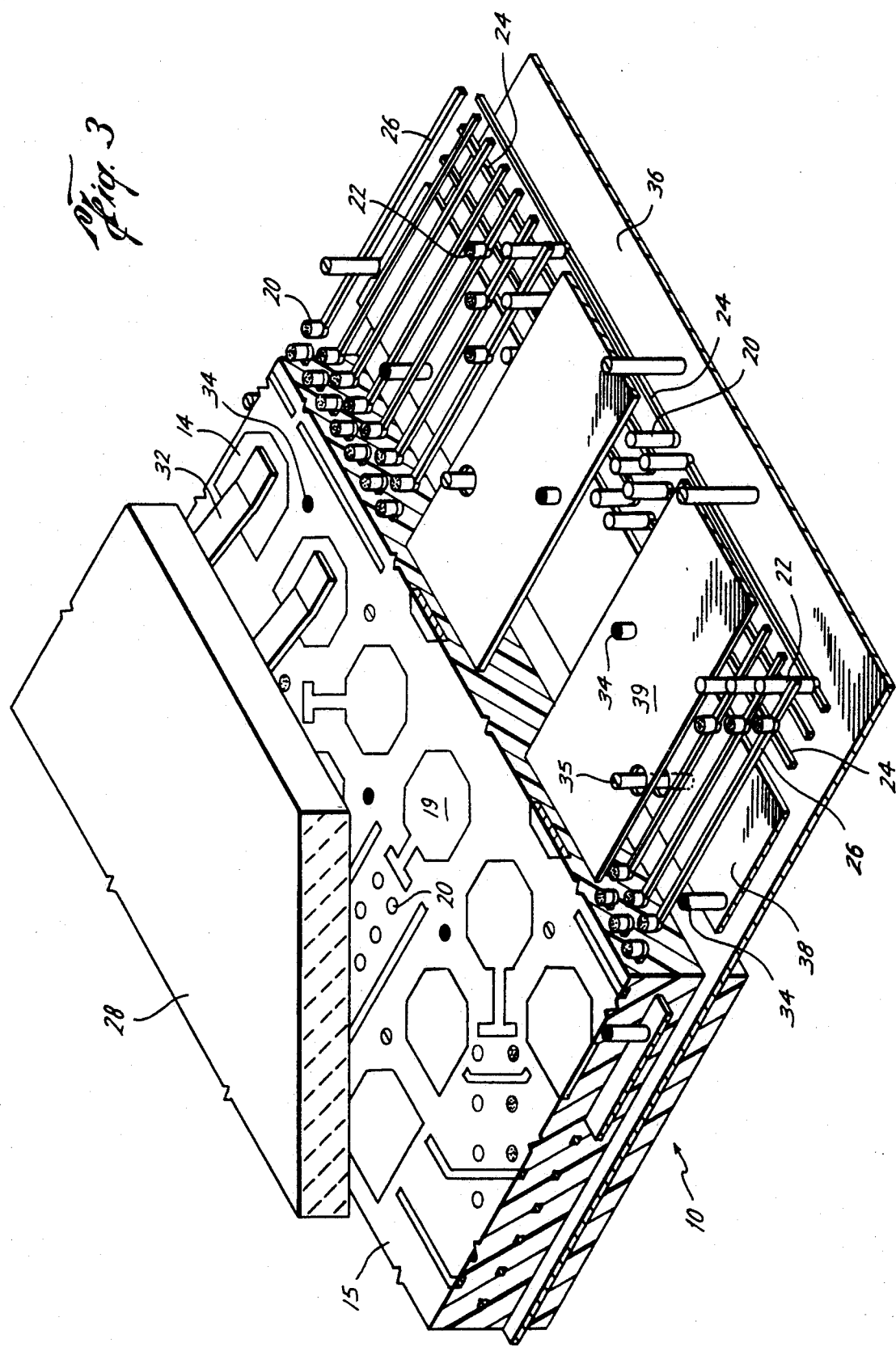
FIG. 3 is a partial cutaway view along plane 3 of FIG. 2 showing cutaway electrical component and underlying layers.

Shown in FIG. 1 and FIG. 2 are power and ground vias 34 and 35, respectively, interspersed between bonding pads 14 and extending from surface layer 15 downward to grounding layer 36 or orthogonally placed power buses 38 or 39 shown in FIG. 3. Vertical power buses 39 are arranged within the same intermediate layer as Y-conductors 26, while horizontal power buses 38 are arranged with X-conductors 24. As shown in FIG. 1 and FIG. 2, the power and ground vias 34 and 35 are arranged such that the shaded, power vias 34 connect to underlying horizontal or vertical power buses 38 or 39, respectively, while non-shaded, ground vias 35 connect to underlying grounding layer 36. Means by which the non-shaded, ground vias 35 extend to the grounding layer 36 through openings placed in power buses 38 or 39, is further illustrated in FIG. 3. The purpose in connecting ground and power vias 35 and 34 to alternating grounding layer 36 and power buses 38 or 39, respectively, is to provide power or ground access to each bonding pad 14. The designer can choose to connect upon the surface layer any bonding pad 14 to either ground or power. Surface interconnect of ground or power can be easily done between each bonding pad 14 and the selected ground or power vias 35 or 34.

FIG. 3 not only illustrates orthogonally placed power buses 38 and 39, and underlying ground layer 36 to which power and ground vias 34 and 35 connect, but also illustrates underlying layers within cut-out plane 3 of FIG. 2. FIG. 3 shows a partial cutaway view of section 3 having intermediate layers placed below surface layer 15 shown in FIG. 2. Electrical component 28, suspended above surface layer 15, is shown partially cutaway revealing underlying surface layer 15. Bonding leads 32 connect bonding surfaces underneath electrical component 28 to bonding pads 14. Placed beneath surface layer 15 are intermediate layers shown by cutout of the surface layer. The top intermediate layer contains a plurality of parallel Y-conductors 26 and vertical power buses 39. Placed below the vertical Y-conductors 26 and power bus 39 are horizontal X-conductors 24 and power bus 38. Continuation vias 20 are configured at the outer edges of each interconnect cell 12 extending from the surface layer downward to the terminal ends of each Y-connector 26. Also shown are continuation vias 20 extending from the surface layer downward to the terminal ends of each X-conductor 24. Corner-turning vias 22 are shown in the areas where Y-conductors 26 overlap the X-conductors 24. Corner-turning vias 22 are configured diagonally such that one row of diagonal vias connect to underlying X-conductors 24 while a second row of diagonal vias connect to orthogonally placed Y-conductors 26.

The multi-layered interconnect substrate 10 is shown with power buses 38 and 39 coplanar and within the same layer as X-conductors 24 and Y-conductors 26, respectively. While it is preferred that power buses 38 and 39 be placed within the intermediate layers having parallel X- and Y-conductors 24 and 26, respectively, it is to be appreciated that power buses 38 and 39 need not be contained within those layers. A separate layer can be utilized similar to grounding layer 36, whereby power buses 38 and 39 no longer need be placed upon the intermediate layers. While power buses 38 and 39 can be placed on an independent power layer, fabrication of a separate power layer requires additional processing steps adding to the complexity of universal substrate 10. Placing power buses 38 and 39 within a separate layer will not add to the performance of the present invention. Therefore, it is not necessary that power buses 38 and 39 be withdrawn from the intermediate layers and placed on an individual layer. Since power buses 38 and 39 do not occupy potentially active substrate area, placing buses 38 and 39 on intermediate layers does not decrease the interconnect placement efficiency of the system. The substrate through which power buses 38 and 39 traverse is that under which bonding pads 14 are placed on the surface layer. Vertical Y-conductors 26 extend under a row of bonding pads 14 on a different intermediate layer from horizontal power buses 38 placed below a horizontal row of bonding pads 14. Conversely, horizontal X-conductors 24 extend under a column of bonding pads 14 on a different intermediate layer from vertical power buses 39 placed below a vertical column of bonding pads 14.

Figure 4:
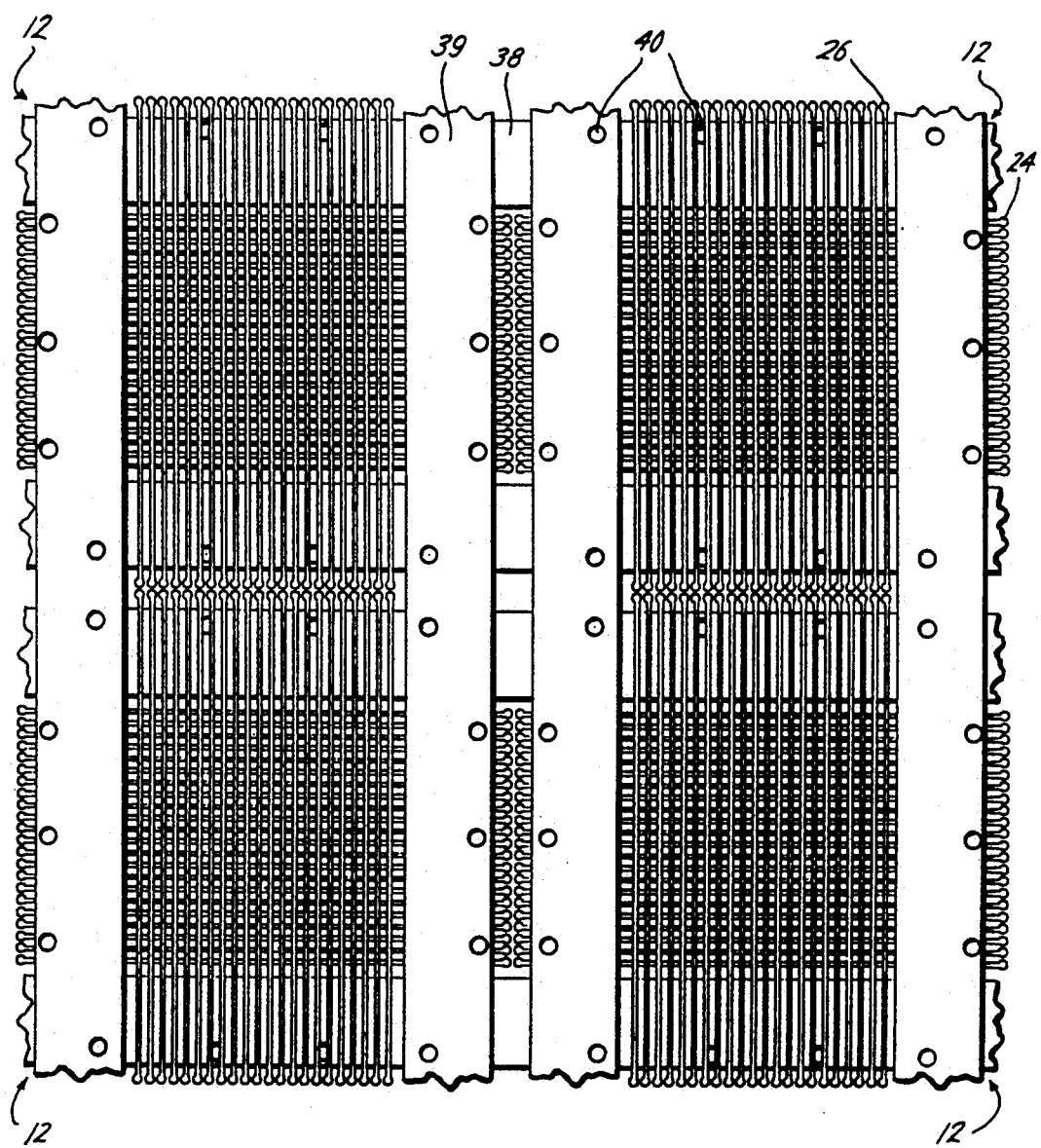
FIG. 4 is a top view of the first and second intermediate layers contained within four interconnect cells of the present invention.

FIG. 4 illustrates the two intermediate layers contained within four interconnect cells 12. Each vertical and horizontal power bus 39 and 38, respectively, having a plurality of openings 40 through which ground vias 35 extend. Ground vias 35 extend from the surface layer to underlying grounding layer 36. Ground vias 35 are of smaller diameter than each opening 40 through which ground vias 35 extend. By making the ground via 35 diameters smaller than the opening 40 diameter, shorting of interconnect substrate 10 will not occur. Vertical power buses 39 are parallel and extend the entire length of interconnect substrate 10. Conversely, horizontal power buses 38 are also parallel and extend the entire width of universal interconnect substrate 10. Placed between vertical power buses 39 are a plurality of parallel, vertical Y-conductors 26 extending only the length of one interconnect cell 12. In addition, placed between horizontal power buses 38 are a plurality of parallel, horizontal X-conductors 24 extending the length of one interconnect cell 12. X- and Y-conductors 24 and 26 are placed on separate layers and insulated within each layer by an insulating material contained within interconnect substrate 10. Formed at selected cross-over points of each X-and Y-conductors 24 and 26 are corner-turning vias 22 shown in FIGS. 1–2 as diagonally configured within each interconnect cell 12. Moreover, FIGS. 1–2 illustrates horizontal rows or vertical columns of continuation vias 20 formed between adjacent interconnect cells 12 at the terminal ends of X- and Y-conductors 24 and 26.

Figure 5:
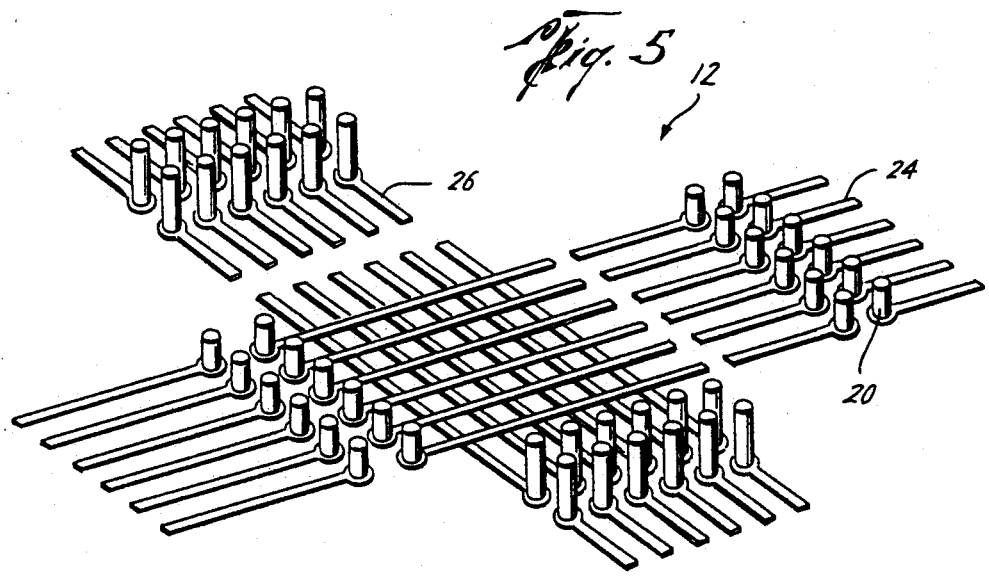
FIG. 5 is a perspective view of two sets of parallel conductors placed orthogonally within first and second intermediate layers.

FIG. 5 illustrates a perspective view of X- and Y-conductors 24 and 26, respectively, contained within a single interconnect cell 12. In this embodiment, Y-conductors 26 are shown below X-conductors 24. It is to be appreciated that Y-conductors 26 can be placed either above or below X-conductors 24. Deciding whether Y-conductors 26 or X-conductor 24 are to be placed on the top, is dependent upon design consideration. If the X-conductor 24 is more frequently used, then it should be placed on top with Y-conductor 26 placed below. Although FIG. 5 does not illustrate corner-turning vias due to drawing constraints, it does show continuation vias rising from the terminal ends of both X- and Y-conductors 24 and 26 to the surface layer.

Figure 6:
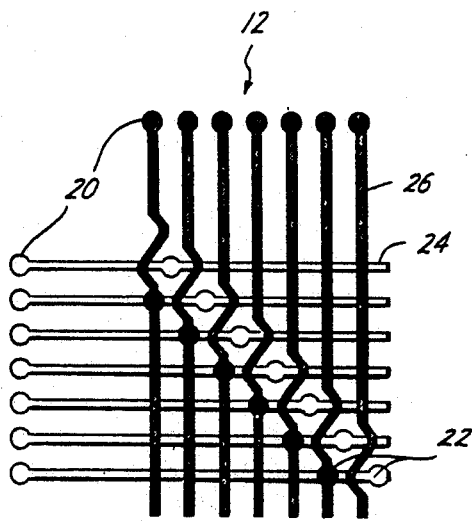
FIG. 6 is a top perspective view of the orthogonally placed parallel conductors of FIG. 5, showing curvilinear interconnect junctions at each cross-over point.

FIG. 6 is a partial top view of an interconnect cell 12. Both continuation and corner-turning vias 20 and 22, respectively, are shown with Y-conductors 26 overlying X-conductors 24. Although not shown in previous figures, FIG. 6 illustrates the method by which overlying Y-conductor 26 may be routed around corner-turning vias 22 placed upon underlying X-conductors 24. A minimum spacing is required between overlying Y-conductor 26 and corner-turning vias 22 rising through the same layer in which Y-conductors 26 traverse. To maintain the required minimum space between overlying Y-conductors 26 and corner-turning vias 22, while keeping the space between adjacent X-and Y-conductors 24 and 26 to a minimum, it is important to route the overlying Y-conductors 26 as shown. If high-density interconnect is not essential to the design, the spacing between X- and Y-conductors 24 and 26 can be increased wherein detoured routing is not needed.

Figure 7:
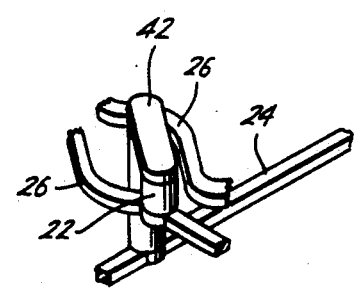
FIG. 7 is a perspective view of an intermediate junction at a single cross-over point showing connection from the surface layer downward to one set of orthogonal conductors.

FIG. 7 illustrates a connected pair of corner-turning vias 22 near the intersection of X- and Y-conductors 24 and 26, respectively. Placed on surface layer 15 is conductive link 42 connecting the upper surfaces of the pair of corner-turning vias 22. Conductive link 42 is programmable and can be selectively placed at various locations upon the surface layer. Moreover, conductive link 42 is of uniform geometry and can be deposited upon the surface layer by either photolithography methods or direct laser deposition. If direct laser write techniques are used, programming can be done without requiring expensive clean-room facilities. The end-user can completely customize the circuit using a single laser and depositing uniform laser lengths upon surface layer 15.

Although FIG. 7 illustrates conductive links 42 placed only on the top surfaces of corner-turning vias 22, the principal advantage of the present invention is that programmable conductive links 42 can also be used to connect: 1) bonding pads 14 to corner-turning surface connectors 16, 2) corner-turning surface connectors 16 to corner-turning vias 22, 3) corner-turning vias 22 to corner-turning vias 22, 4) continuation vias 20 on one interconnect cell 12 to continuation vias 20 on an adjacent interconnect cell 12, 5) bonding pads 14 to power or ground vias 34 or 35, 6) a partitioned channel-hop bus 18 to an adjacent, collinear partitioned channel-hop bus 18, 7) channel-hop bus 18 to continuation vias 20, or 8) channel-hop bus 18 to continuation pads 19. The various locations in which conductive links 42 can be placed upon the surface layer are shown in FIG. 8.

Figure 8:
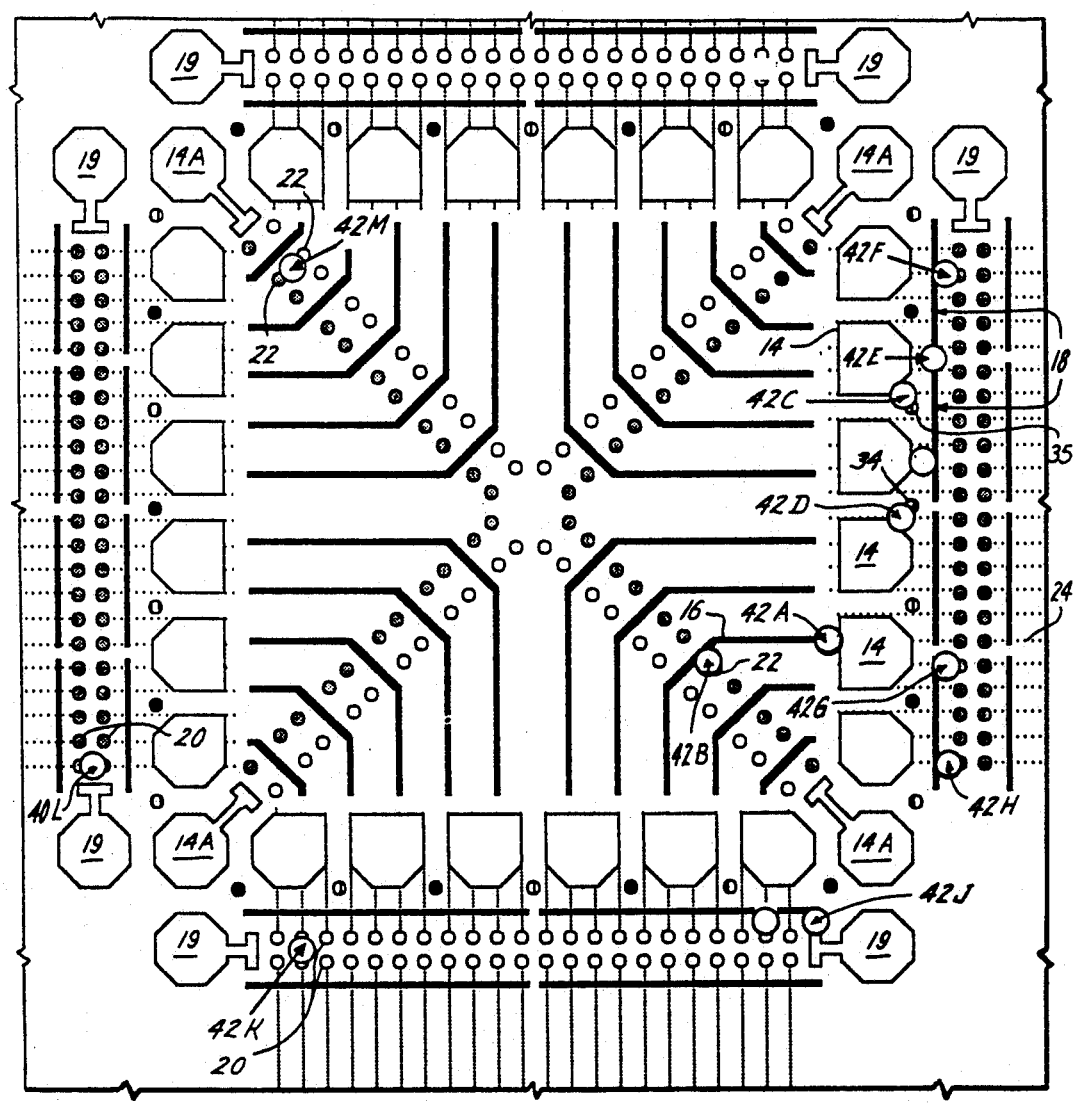
FIG. 8 is a top surface view of a single interconnect cell of the present invention showing programmable conductive links placed at selective points upon the surface layer.

FIG. 8 illustrates the numerous locations in which conductive links 42 can be programmed upon the surface layer. Each conductive link 42 is of uniform geometry wherein each link is of equal size. The conductive links 42 shown in FIG. 8 have equal length and width (i.e. circular shape), however, conductive links 42 need not be circular and can be rectangular and square. It is only important that the links 42 be small regardless of their overall shape. When connecting bonding pad 14 to an underlying X-conductor 24 or underlying Y-conductor 26, bonding pad 14 must be linked to corner-turning connector 16 via conductive link 42A. Corner-turning connector 16 is then connected to an underlying X-conductor 24 by placing conductive link 42D between corner-turning connector 16 and corner-turning vias 22. Corner-turning vias 22 which connect to X-conductors 24 are shown as shaded circles in FIG. 8, and also in FIGS. 1 and 2. Bonding pad 14 can also be connected to power bus 38 or 39 by placing conductive link 42C between bonding pad 14 and power via 34. If bonding pad 14 is to be connected to grounding layer 36, conductive link 42D is placed between bonding pad 14 and ground via 35. Channel-hop buses 18 can be connected with conductive link 42E placed between each pair of channel-hop buses 18. Channel-hop bus 18 can be connected to underlying X-conductors 24 by placing various conductive links 42F, 42G and 42H between continuation vias 20 and channel-hop buses 18. Channel-hop buses 18 are used to route signals coming from continuation bonding pads 19A placed between interconnect cells 12 and collinear with rows or columns of continuation vias 20. Continuation bonding pads 19 are connected to channel-hop buses 18 by conductive link 42J. Continuation bonding pads 19 are placed adjacent to octagonal pads 14A so that the even spacing between bonding pads 14 is maintained from interconnect cell 12 to adjacent interconnect cell 12. Y-conductors 26 can be extended from one cell 12 to an adjacent cell 12 by placing conductive link 42K between horizontal rows of continuation vias 20. Conversely, X-conductors 24 can be connected from one cell 12 to an adjacent cell 12 by placing conductive link 42L on surface layer 15 between continuation vias 20. In addition to being able to extend X-conductors 24 and/or Y-conductors 26 between adjacent cells 12, X-conductors 24 can be routed to Y-conductors 26 within each interconnect cell 12 by simply placing conductive link 42M between diagonally configured corner-turning vias 22.

Because each X- and Y-conductor 24 and 26 can extend, terminate, or change direction 90' from its initiation point, within each interconnect cell 12, efficient routing is achieved. Instead of traversing the entire length of interconnect substrate io, interconnect can be routed directly to the target area without deviating more than one interconnect cell 12 from the most direct path. While the size of interconnect cell 12 can be varied, it is preferred to use a cell size sufficiently large to enable a plurality of X- and Y-conductors 24 and 26 to traverse each cell, but not too large to take away from the routing efficiency and direct interconnect path achievable by using smaller cells 12. If the X- and Y-conductors 24 and 26 are chosen such that the conductors are 15 microns wide with 55 micron pitch, and bonding pads are 6 ml wide and 8.5 ml pitch, cell size can be chosen to be approximately 75 ml per side. Therefore, if a 2½"×2½" interconnect substrate 10 is used, then 34×34 interconnect cells 12 are needed. As with the interconnect cells 12, appropriate dimensions of conductive links 40 are dependent upon the chosen width of X- and Y-conductors 24 and 26 and the spacing between those conductors. If the conductor width is 15 microns and the spacing is 40 microns, then a 40-micron circular conductive link 40 could be used. Depending upon design constraints of the X- and Y-conductors 24 and 26, bonding pads 14, corner-turning surface connectors 16, continuation vias 20, corner-turning vias 22 and power and ground vias 34 and 35, conductive links 42 can be made in any shape desired so long as conductive links 42 are relatively small in comparison to underlying X-or Y-conductor 24 and 26 lengths.

Figure 9:
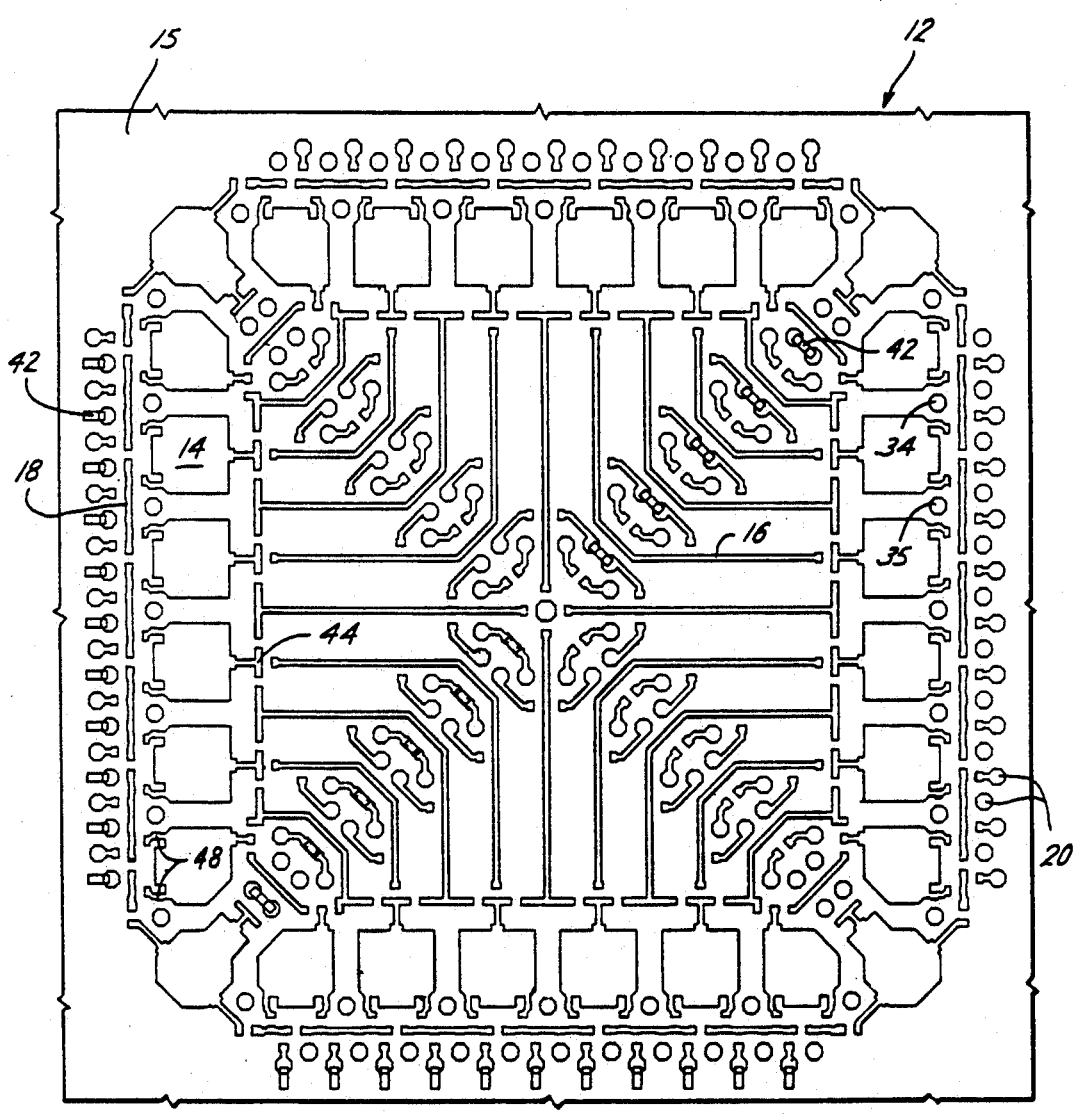
FIG. 9 is a top view of another preferred embodiment of a single interconnect cell at the present invention.

Referring to FIG. 9, another preferred embodiment showing surface layer 15 of interconnect cell 12. FIG. 9 depicts four changes that can be made to surface layer 15 such that interconnect flexibility can be increased and X and/or Y-conductor (not shown in FIG. 9) spacing can be decreased. Thus, FIG. 9 illustrates interconnect cell 12 which can accommodate a wider range of surface interconnect and more X and Y-conductors within each cell 12. The first modification is inside protrusions 44 placed internal to bonding pads 14. By placing a conductive link 42 adjacent one or more inside protrusions 44, a signal on one bonding pad 14 can be routed to any other bonding pad 14 of interconnected cell 12. Routing occurs either by a bus that can be formed around the inside of pad 14 via inside protrusions or across interconnect cell 12 via one or more corner-turning connectors 16. Inside protrusions 44 provide a more flexible routing scheme and is preferred when substantial amounts of rerouting are needed. The second modification is performed on continuation vias 20 by staggering the location of continuation vias 20. As is shown in FIG. 9, continuation vias 20 are staggered so that more X and Y-conductors can be accommodated in each interconnected cell. Staggering continuation vias 20 alleviates shorting problems that may exist if X and Y-conductors are closely packed. The staggered configuration allows for a minimum gap of 20 microns, instead of a non-staggered 15 micron gap minimum which can be accomplished in the embodiment shown in FIGS. 1, 2, 3, 4, 5 and 8. However, it is to be understood that as design constraints permit, even narrower gaps can be permitted by using the staggered configuration. The third modification is to bonding pads 14. Bonding pads 14 are reconfigured so that outside protrusions 48 extend outward from bonding pad 14 in close proximity with surface interconnect. The small surface area between outside protrusions 48 and surface interconnect (i.e., either power or ground vias 34 and 35 and channel-hop buses 18) is of sufficient geometry to accommodate standard-sized conductive links 42 placed elsewhere on cell 12. Outside and inside protrusions 44 and 48 provide better thermal matching between bonding pad 14 and surface interconnect. Instead of going from a relatively large area bonding pad to a relatively small area surface interconnect, protrusions 44 and 48 function to maintain a more constant mass displacement so that thermal matching and, consequently, continuity is improved. The fourth modification of the preferred embodiment of FIG. 9 is conductive link 42 which is of short rectangular geometry. Although FIG. 8 illustrates round or circular conductive links 42, as stated earlier, conductive links 42 can be of any geometry provided they are relatively small and are easily placed. FIG. 9 shows that conductive links 42 can be rectangular as well as circular in shape.

It is understood that the invention is not confined to the particular construction set forth herein, but in basis such modified forms thereof which have come within the scope of the following claims.

What is claimed is:
1. A universal interconnect substrate, comprising:
   a plurality of regularly spaced interconnect cells, each said interconnection cell comprising:
     a first intermediate layer comprising a plurality of substantially parallel X-conductors substantially extending the length of said cell;
     a second intermediate layer comprising a plurality of substantially parallel Y-conductors substantially extending the width of said cell; and
     a surface layer configured above said first intermediate layer and said second intermediate layer, said surface layer comprising:
       i. a plurality of substantially equally spaced bonding pads configured about the outer boundary of each said cell, wherein the spacing between cells is such that the bonding pad spacing is continuous from cell to cell;
       ii. a plurality of corner-turning connectors converging inward from said bonding pads, each connector spaced substantially equal distance from adjacent said connector;
       iii. programming means for selectively connecting said X-conductors and said Y-conductors to said bonding pads; and
       iv. means for connecting said bonding pads to at least one electrical component placeable upon said surface layer,
   wherein said programming means comprises:
     a grounding layer;
     a plurality of power buses arranged on said first and second intermediate layers;
     a plurality of continuation vias extending vertically downward from said surface layer to the terminal ends of said X- or Y-conductors;
     a plurality of corner-turning vias extending downward from said surface layer to an intermediate point of said X- or Y-conductors;
     a plurality of power vias extending vertically downward from said surface layer to said power buses;
     a plurality of ground vias extending downward from said surface layer to said grounding layer; and
     a plurality of programmable conductive links, each conductive link having fixed geometry and placed on said surface layer for selectively connecting said continuation vias, said corner-turning vias, said bonding pads to said power and ground vias, and said bonding pads to said corner-turning connectors.

2. The universal interconnect substrate of claim 1, said conductive links being short with respect to said X-or Y-conductors.

3. The universal interconnect substrate of claim 1, said conductive links electrically connecting said continuation vias.

4. The universal interconnect substrate of claim 1, said conductive links electrically connecting said corner-turning vias.

5. The universal interconnect substrate of claim 1, said X-conductors and said Y-conductors being substantially orthogonal to one another forming non-interrupted cross-over points near said corner-turning vias.

6. The universal interconnect substrate of claim 1, said conductive links being short relative to said X- of Y-conductors.

7. The universal interconnect substrate of claim 1, said conductive links electrically connecting said continuation vias.

8. A universal interconnect substrate, comprising:
a plurality of regularly spaced interconnect cells, each said interconnecting cell comprising:
  a first intermediate layer comprising a plurality of substantially parallel X-conductors substantially extending the length of said cell;
  a second intermediate layer comprising a plurality of substantially parallel Y-conductors substantially extending the width of said cell, said X-conductors and said Y-conductors being orthogonal to one another forming non-interrupted cross-over points; and
  a surface layer configured above said first intermediate layer and said second intermediate layer, said surface layer comprising:
    i. a plurality of substantially equally spaced bonding pads configured about the outer boundary of each said cell, wherein the spacing between cells is such that the bonding pad spacing is continuous from cell to cell;
    ii. a plurality of corner-turning connectors converging inward from said bonding pads, each connector spaced substantially equal distance from adjacent said connector;
    iii. programming means for selectively connecting said X-conductors and said Y-conductors to said bonding pads; and
    iv. means for connecting said bonding pads to at least one electrical component placeable upon said surface layer.

9. A universal interconnect substrate, comprising:
a plurality of substantially square interconnect cells configured side-by-side and spaced equal distance from one another, each said interconnect cell comprising:
  a grounding layer comprising a substantially planar conductive element;
  a first interconnect layer comprising a plurality of substantially parallel X-conductors substantially extending the length of said cell;
  a second interconnect layer comprising a plurality of substantially parallel Y-conductors substantially extending the width of said cells;
  a power layer comprising a substantially planar conductive element; and,
  a surface layer configured above said grounding layer, said first intermediate layer and said second intermediate layer, said surface layer comprising:
    i. a plurality of equally spaced bonding pads configured about the outer boundary of each said cell, wherein the spacing between cells is such that the bonding pad spacing is continuous from cell to cell;
    ii. a plurality of corner-turning connectors converging inward from said bonding lead pads, each corner-turning connector spaced equal distance from adjacent said corner-turning connector;
    iii. programming means for selectively connecting said X-conductors, said Y-conductors, said grounding layer, and said power buses to said bonding pads;
    iv. means for connecting said bonding pads to at least one electrical component placeable upon said surface layer; and,
  a pair of connector bonding pads placed on said surface layer between each cell and substantially collinear with said bonding pads such that the spacing between said connector bonding pad and adjacent said bonding pads equals the distance between bonding pads.

10. The universal interconnect substrate of claim 9, said programming means comprising:
  a plurality of continuation vias extending substantially vertically downward from said surface layer to the terminal ends of said X- or Y-conductors;
  a plurality of corner-turning vias extending substantially vertically downward from said surface layer to an intermediate point of said X- or Y-conductors;
  a plurality of power and ground vias extending substantially vertically downward from said surface layer to said power layer or said grounding layer;
  a plurality of substantially collinear channel-hop buses extending between the outer edge of said bonding pads and said continuation vias; and
  a plurality of programmable conductive links, each conductive link having substantially uniform geometry and placed on said surface layer for selectively connecting said continuation vias, said corner-turning vias, said bonding pads to said power and ground vias, said connector bonding pads to said connector buses, said channel-hop buses and said bonding pads to said corner-turning connectors.

11. The universal interconnect substrate of claim 9, said conductive links electrically connecting said corner-turning vias.

12. A customizable circuit comprising:
a universal interconnect substrate having a plurality of interconnect cells placed side-by-side and equally spaced apart, each interconnecting cell comprising:
  a grounding layer comprising a planar conductive element;
  a first intermediate layer comprising a plurality of substantially parallel X-conductors and power buses substantially extending the length of said cell;
  a second intermediate layer comprising a plurality of substantially parallel Y-conductors and power buses substantially extending the width of said cell, said C-conductors and said Y-conductors overlapping and crossing at a plurality of crossing points;
  a plurality of continuation vias formed at the terminal ends of each said X-conductors and said Y-conductors;
  a plurality of pairs of corner-turning vias formed near said plurality of crossing points; and,
  a surface layer comprising:
    a plurality of bonding pads surrounding each said interconnect cell;
    a plurality of corner-turning connectors converging inward from said bonding pads, each corner-turning connector spaced substantially equal distance from said adjacent corner-turning connector; and,
    programming means for selectively connecting:
      i. said bonding pads to said corner-turning connectors;
      ii. said corner-turning connectors to said pairs of corner-turning vias, whereby said corner-turning connectors are selectively connected to either X- or Y-conductors;

iii. said continuation vias of each said interconnect cell to continuation vias on adjacent said interconnect cells;
iv. said pairs of corner-turning vias; and,
at least one electrical component bonded to a selected set of said plurality of bonding pads.

13. The customizable circuit of claim 12, at least one said electrical component having larger area than said interconnect cell.

14. The customizable circuit of claim 12, said X-conductors and said Y-conductors being substantially orthogonal to one another forming non-interrupted crossover points near said corner-turning vias.

15. The customizable circuit of claim 12, said programming means comprising a plurality of programmable conductive links, each conductive link having substantially uniform geometry placed on said surface layer.

16. The customizable circuit of claim 12, the universal interconnect substrate further comprising a plurality of power and ground vias placed along the outer boundaries of each said interconnects cell interspersed between a plurality of said bonding pads configured to provide each bonding pad with access to either said power buses or said ground layer.

17. The customizable circuit of claim 12, the universal interconnect substrate further comprising an insulating medium for electrically isolating said surface layer, said first intermediate layer, said second intermediate layer, and said ground layer.

18. A customizable circuit of claim 12, said electrical component being configured above at least one of said interconnect cells, said interconnect cells being aligned such that the spacing between the bonding pads of adjacent interconnect cells is equal to the spacing between bonding pads within each interconnect cell.

19. A customizable circuit comprising:
a universal interconnect substrate having a plurality of substantially square interconnect cells configured side-by-side and spaced substantially equal distance from one another, each said interconnect cell comprising:
a grounding layer comprising a substantially planar conductive element;
a first intermediate layer comprising a plurality of substantially parallel coplanar X-conductors horizontally extending substantially the entire length of said interconnect cell, each said X-conductor being electrically insulated from adjacent said X-conductors within said substrate;
a second intermediate layer comprising a plurality of substantially parallel coplanar Y-conductors vertically extending substantially the entire width of said interconnect cell, said Y-conductors and said X-conductors crossing substantially orthogonally at a plurality of crossing points, each said Y-conductor being electrically insulated from adjacent said Y-conductors and from said X-conductors within said substrate;
a plurality of substantially horizontal power conductors placed on said first intermediate layer extending the entire length of said interconnect cell and being electrically insulated from said X-conductors and said Y-conductors;
a plurality of vertical power conductors placed on said second intermediate layer extending the entire length of said interconnect cell and being electrically isolated from said X-conductors and said Y-conductors;
a plurality of continuation vias formed at the terminal ends of each said X-conductor and said Y-conductor;
a plurality of pairs of corner-turning vias formed near said plurality of crossing points;
a plurality of power and ground vias; and,
a programmable surface layer placed above said first and said second intermediate layer, said programmable surface layer comprising:
a plurality of equally spaced bonding pads configured about the outer boundary of each said interconnect cell, wherein the spacing between cells is such that the bonding pad spacing is continuous from cell to cell;
a plurality of corner-turning connectors converging inward from said bonding pads, each corner-turning connector being spaced substantially equal distance from said adjacent corner-turning connector;
a plurality of channel-hop buses configured between said interconnect cells;
a pair of connector bonding pads placed on said surface layer between each cell and substantially collinear with said bonding pads such that the spacing between said connector bonding pad and adjacent said bonding pads substantially equals the distance between bonding pads; and,
programming means for selectively connecting:
i. said bonding pads to said shaped connectors;
ii. said corner-turning connectors to said pairs of corner-turning vias;
iii. said continuation vias of said inter-connect cell to continuation vias on adjacent said interconnect cells;
iv. said pairs of secondary junctions;
v. said bonding pads to said power and ground vias, whereby said bonding pads are selectively connected to either power buses or ground layer buses;
vi. said connector bonding pads to said connector buses;
vii. said channel-hop buses;
viii. said channel-hop buses to said continuation vias; and,
an electrical component bonded to the top of said universal interconnect substrate, said electrical component having bonding surface connectable to said plurality of bonding pads.

20. The customizable circuit of claim 19, at least one said electrical component having larger area than each said interconnect cell.

21. The customizable circuit of claim 19, said programming means having conductive links that are short relative to said X- and Y-conductors.

22. The customizable circuit of claim 19, said programming means having conductive spot links connecting said continuation vias.

23. The customizable circuit of claim 19, said programming means having conductive spot link-s connecting said corner-turning vias.

24. The customizable circuit of claim 19, said programming means having a conductive link, each said conductive link having a length-to-width ratio less than 3.

25. A universal interconnect substrate, comprising:

a plurality of regularly spaced interconnect cells, each said interconnecting cell comprising:
  a first intermediate layer comprising a plurality of substantially parallel X-conductors substantially extending the length of said cell;
  a second intermediate layer comprising a plurality of substantially parallel Y-conductors substantially extending the width of said cell; said X-conductors and said Y-conductors being orthogonal to one another forming non-interrupted cross-over points; and
  a surface layer configured above said first intermediate layer and said second intermediate layer, said surface layer comprising:
    i. a plurality of substantially equally spaced bonding pads configured about the outer boundary of each said cell, wherein the spacing between cells is such that the bonding pad spacing is continuous from cell to cell;
    ii. a plurality of corner-turning connectors converging inward from said bonding pads, each connector spaced substantially equal distance from adjacent said connector;
    iii. conductive links for selectively connecting said X-conductors and said Y-conductors to said bonding pads; and
    iv. said bonding pads are capable of being connected to at lest one electrical component placeable upon said surface layer.

26. The universal interconnect substrate of claim 25, further comprising:
  at least one continuation via extending from said surface layer to said X- and Y-conductors; and
  at lest one corner-turning via extending from said surface layer to said X- and Y-conductors; and wherein
  said conductive links having a geometry capable of being programmably placed abutting said at least one continuation via and said at least one corner-turning via for selectively connecting said at least one electrical component to said X- and Y-conductors.

27. The universal interconnect substrate of claim 25, further comprising:

an underlying power bus in said substrate;
an underlying grounding layer in said substrate;
at least one power via extending from said surface layer to said at least one underlying power bus; and
at least one ground via extending from said surface layer to said at least one underlying grounding layer; and wherein
said conductive links having a geometry capable of being programmably placed abutting said at least one power via and said at least one ground via for selectively connecting said at least one electrical component to said at least one power bus and said at least one grounding layer.

28. A universal interconnect substrate, comprising:
a plurality of regularly spaced interconnect cells, each said interconnecting cell comprising:
  a first intermediate layer comprising a plurality of substantially parallel X-conductors substantially extending the length of said cell;
  a second intermediate layer comprising a plurality of substantially parallel Y-conductors substantially extending the width of said cell; said X-conductors and said Y-conductors being orthogonal to one another forming non-interrupted cross-over points; and
  a surface layer configured above said first intermediate layer and said second intermediate layer, said surface layer comprising:
    i. a plurality of substantially equally spaced bonding pads configured about the outer boundary of each said cell, wherein the spacing between cells is such tat the bonding pad spacing is continuous from cell to cell;
    ii. a plurality of corner-turning connectors converging inward from said bonding pads, each connector spaced substantially equal distance from adjacent said connector; and wherein
    iii. said X-conductors and said Y-conductors are capable of being selectively connected to said bonding pads by conductive links; and
    iv. said bonding pads are capable of being connected to at least one electrical component placeable upon said surface layer.

* * * * *

UNITED STATES PATENT AND TRADEMARK OFFICE
CERTIFICATE OF CORRECTION

PATENT NO. : 5,220,490

DATED : June 15, 1993

INVENTORS : William Weigler and Lawrence N. Smith

It is certified that error appears in the above-identified patent and that said Letters Patent is hereby corrected as shown below:

```
Column 3, line 42, "byside" should be -- by-side --.
Column 8, line 50, "io" should be -- 10 --.
Column 10, line 4 (claim 1), "interconnection" should be
"interconnecting".
Column 12, line 46 (claim 12), "C-conductors" should be
--X-conductors--
Column 14, line 50 (claim 19), "surface" should be
-- surfaces --.
Column 14, line 62 (claim 23), "link-s" should be -- links --.
Column 15, line 28 (claim 25), "lest" should be -- least --.
Column 15, line 34 (claim 26), "lest" should be -- least --.
Column 16, line 32 (claim 28), "tat" should be -- that --.
```

Signed and Sealed this

Twenty-second Day of March, 1994

*Attest:*

BRUCE LEHMAN

*Attesting Officer*   *Commissioner of Patents and Trademarks*